United States Patent [19]

Davies et al.

[11] Patent Number: 4,604,725
[45] Date of Patent: Aug. 5, 1986

[54] ROTARY APPARATUS HAVING CODE TRACK WITH PSEUDO-RANDOM BINARY DIGIT SEQUENCE FOR INDICATING ROTATIONAL POSITION

[75] Inventors: George G. Davies; Stuart M. McGlade; Peter L. Dunn, all of Chelmsford, England

[73] Assignee: The Marconi Company Limited, Stanmore, England

[21] Appl. No.: 495,389

[22] Filed: May 17, 1983

[30] Foreign Application Priority Data

May 18, 1982 [GB] United Kingdom ............... 8214452

[51] Int. Cl.⁴ .................... G06F 15/20; G06F 7/58
[52] U.S. Cl. .................. 364/900; 360/72.2; 250/233; 364/561
[58] Field of Search ................... 360/72.2; 364/200 MS File, 900 MS File, 561; 250/233; 358/310, 335

[56] References Cited

U.S. PATENT DOCUMENTS

| | | | |
|---|---|---|---|
| 3,631,421 | 12/1971 | Perkins | 360/72.2 |
| 4,000,510 | 12/1976 | Cheney et al. | 360/33 |
| 4,009,377 | 2/1977 | Elms | 364/561 |
| 4,072,861 | 2/1978 | Couderc et al. | 250/233 |
| 4,145,745 | 3/1979 | De Bijl et al. | 364/200 |
| 4,485,412 | 11/1984 | Sugiyama et al. | 358/310 |
| 4,496,993 | 1/1985 | Sugiyama et al. | 358/335 |
| 4,507,693 | 3/1985 | Matsuda et al. | 360/72.2 |
| 4,530,018 | 7/1985 | Hoshino et al. | 360/73 |
| 4,550,393 | 10/1985 | Sugiyama et al. | 369/32 |

FOREIGN PATENT DOCUMENTS

| | | |
|---|---|---|
| 1284641 | 8/1972 | United Kingdom . |
| 1511044 | 5/1978 | United Kingdom . |
| 2080646 | 2/1982 | United Kingdom . |

Primary Examiner—Harvey E. Springborn
Assistant Examiner—A. Williams
Attorney, Agent, or Firm—Spencer & Frank

[57] ABSTRACT

A code track on a rotable member (e.g., a disc) defines a pseudo-random sequence of binary digits consisting of ones and noughts. The pseudo-random sequence extends continuously around the rotatable member and includes a given number of n consecutive noughts. The binary digits of the sequence are arranged so that each group of n adjacent digits is different from each other group of n adjacent in the pseudo-random sequence. A reading mechanism is operatively positioned relative to the code track for reading n consecutive digits of the pseudo-random sequence, wherein each n consecutive digits of the pseudo-random sequence define a position of the rotatable member.

5 Claims, 6 Drawing Figures

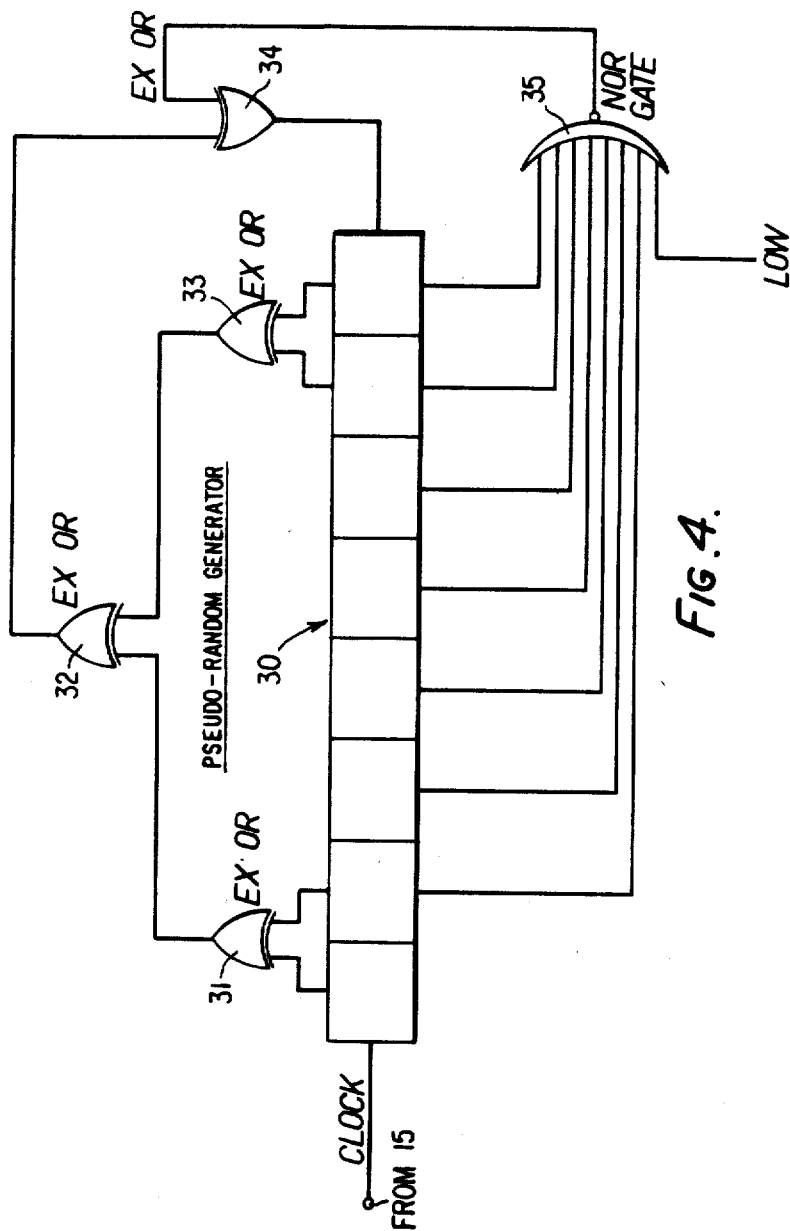

… … …

ROTARY APPARATUS HAVING CODE TRACK WITH PSEUDO-RANDOM BINARY DIGIT SEQUENCE FOR INDICATING ROTATIONAL POSITION

BACKGROUND OF THE INVENTION

This invention relates to apparatus for indicating the position of a member and in particular to apparatus in which a code is carried by the member and is read by some form of detecting means as the member moves to give an indication of its position at any one time.

In a conventional position encoder there are a number (n) of tracks extending on the member in its direction of movement and these tracks are read at respective read points. The simultaneous outputs from all the read heads define a digital word indicating the position of the member.

A problem associated with such position encoders is the difficulty in fitting a large number of read points in the available space and the expense arising from the need for the large number of read heads and associated circuitry.

SUMMARY OF THE INVENTION

It is an object of the invention to provide an apparatus for indicating the position of a member in which the foregoing described problem is minimized or overcome altogether.

This invention provides apparatus for indicating the position of a member, the apparatus including: a first track on the member and defining a sequence of digits; a detector positioned so that the digits move past it when the member moves and arranged to write said digits into one end or other of a shift register the contents of which indicate the said position; a second track on the member and sensing means co-operating with the second track to produce timing signals determining when digits are written into the shift register; and a direction signal which is dependent on the direction of movement of the member and which determines into which end of the shift register the digits are written.

By employing the invention it is strictly necessary to have only one track containing information defining the position of the member and one track for providing timing signals. Thus in the simplest form of the invention only two read heads or equivalent read points are required, one for each track. However, when the member is able to move in opposite directions it is desirable to provide for additional read points in a manner which will become apparent later.

The member whose position is to be detected is commonly a rotatable member and accordingly another aspect of the invention provides apparatus for indicating the position of a rotatable member comprising a pseudo-random sequence of digits extending continuously around the member, the sequence being such that all groups of n adjacent digits are different; and means for reading n adjacent digits from the member to give an indication of its position.

This condition may be achieved by generating a pseudo-random code of a maximum bit length of $2^N$, giving a unique bit pattern over any N consecutive bits. Such a code includes N consecutive zeroes and N consecutive ones and its generation is described later.

In this specification reference to movement of a member is to be construed as meaning relative to some datum. Thus a member could be considered to be moving, even if it were fixed relative to the ground or an observer, relative to the datum.

One way in which the invention may be performed will now be described by way of example with reference to the accompanying drawings in which:

BRIEF DESCRIPTION OF THE DRAWINGS

FIG. 1A is a diagram showing a plan view of parts of tracks and positions of reading heads shown in FIG. 1;

FIG. 4 is a circuit schematic which shows part of FIG. 2 in greater detail.

DESCRIPTION OF THE PREFERRED EMBODIMENT

Figure 1:
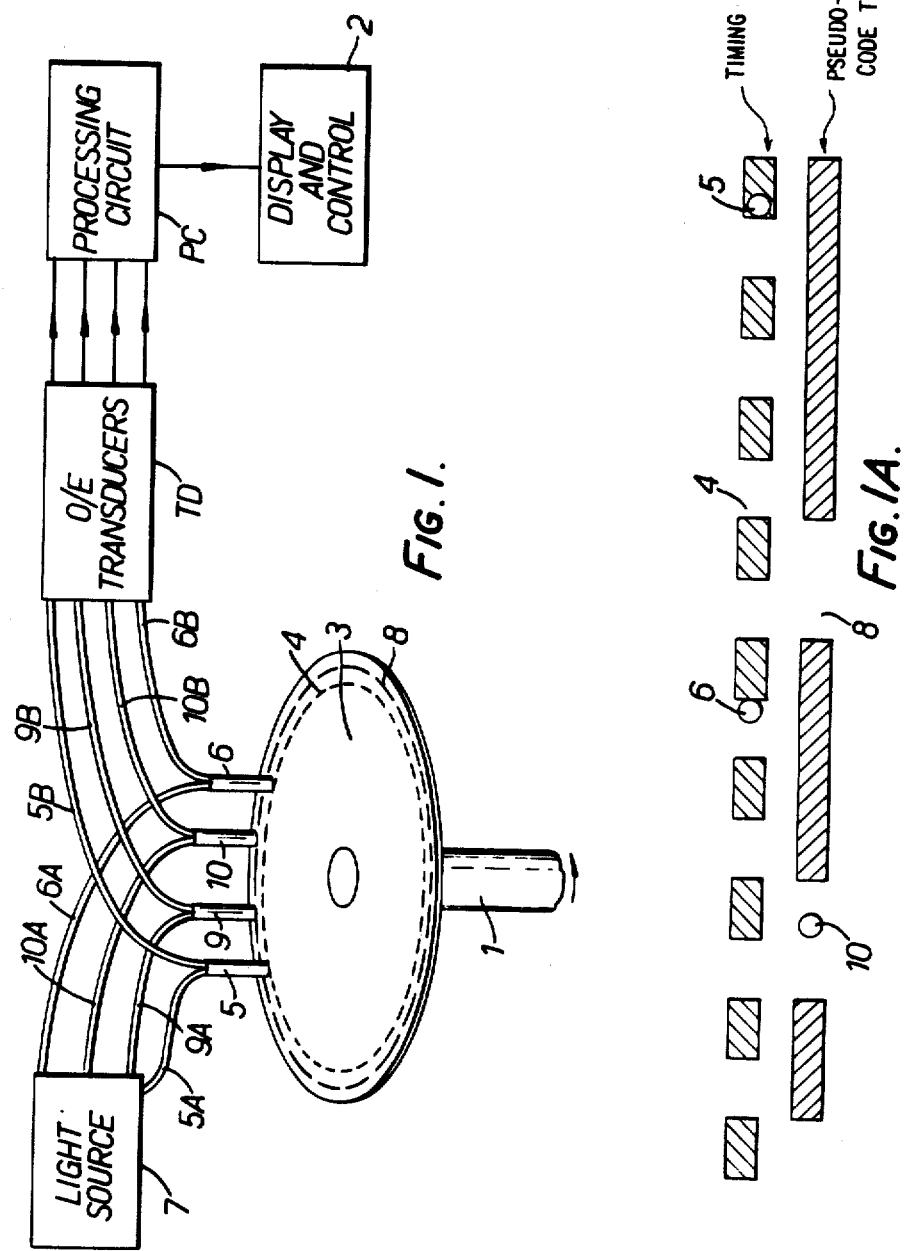
FIG. 1 is a perspective view and block circuit diagram of apparatus constructed in accordance with the invention.

A shaft 1, as shown in FIG. 1, has a drive (not shown) controlled from a circuit 2. A disc 3 is attached to rotate with the shaft 1.

One surface of the disc 3 has a timing track 4 around its circumference, the timing track 4 comprising a number of marks spaced at regular intervals. Two read heads 5 and 6 are positioned, as more clearly shown in FIG. 1A, relative to the timing track 4. Light is transmitted from a light source 7 along optical fibres 5A and 6A to read heads 5 and 6, respectively. These guide the light so that it falls on the timing track 4 which, if there is no mark there, reflects it back to the read head from which it has come and to further optical fibres 5B and 6B, producing signals denoted by A and B, respectively, on FIGS. 2 and 3. As shown in FIG. 1A, read heads 5 and 6 are spaced apart by arranged so that they are a nonintegral multiple of intervals between timing marks.

A pseudo-random track 8 also lies on the surface of the disc 3, being concentric with and outside the timing track 4. The pseudo-random track 8 consists of marks which represent binary digits, arranged so that n adjacent digits form a word which defines the position of the disc 3 and hence the shaft 1. Two read heads 9 and 10 are positioned to co-operate with the pseudo-random track 8 to detect the digits. The position of one of these read heads 10 relative to the track is shown on FIG. 1A. The read heads 9 and 10 operate in a similar manner to the read heads 5 and 6 of the timing track 4, receiving light from the light source 7 along optical fibres 9A and 10A and transmitting the modified optical signals, denoted by C and D, respectively, on FIGS. 2 and 3, along optical fibres 9B and 10B. The read heads 9 and 10 at the pseudo-random track 8 are spaced apart in the direction of the track. They may be spaced apart by n digits of the track but this is not essential and in this preferred embodiment they are spaced n-1 digits apart. In this particular embodiment n is equal to eight.

The four signals A, B, C and D from the read heads 5, 6, 9 and 10 are transmitted to optical-to-electrical transducers TD where the optical signals are converted into electronic signals. The electronic signals are then transmitted to a processing circuit PC which determines the position of the shaft 1 from the signals and feeds the position signal to the circuit 2, which displays the position and controls the drive to the shaft 1.

The processing circuit PC will be described in greater detail with reference to FIGS. 2 to 4.

The signals A and B from the timing track 4 are entered into a logic circuit 11. The signals A and B are used in this circuit 11 to generate clock pulses E, a clock pulse being produced when B is high and A changes state. The logic circuit 11 also controls the input of data from the pseudo-random track 8. It produces signals G and F which determine which one of the read heads 9 and 10 provides a signal to be fed into an input shift register 12. It is arranged so that the leading read head of the pseudo-random track 8, with respect to the direction of rotation provides the input signal to the input shift register 12. The other signal is inhibited as indicated by broken lines in pulse trains C and D in FIG. 3. The signals F and G are such that they change state when B is high and a leading edge of A follows a trailing edge thereof or vice versa.

The input shift register 12 contains an 8-bit electronic representation of the pseudo-random track 8 between and including the read heads 9 and 10 at all times after one or the other of the read heads 9 and 10 has traversed 8-bits of the pseudo-random track 8. The input shift register 12 has an 8-bit output on parallel lines 13.

A clock generator 14 provides clock signals via an OR gate 15 for a pseudo-random generator 16 which is illustrated in greater detail in FIG. 4. Pseudo-random generator 16 comprises an 8-bit shift register 30 which is connected in a circuit of exclusive OR gates 31–34 and a NOR gate 35 as shown in FIG. 4 to produce a pseudo-random binary sequence in a manner readily understood by those skilled in the art. The generator 16 is designed to generate the same pseudo-random sequence as is defined by the pseudo-random track 8 on the disc 3 and this sequence includes the binary numbers 00000000 and 11111111. The clock generator 14 has a frequency which is sufficiently high to ensure that the pseudo-random generator 16 is clocked through its whole sequence between clock signals E for the highest contemplated speed of movement of the disc 3. The output from the pseudo-random generator 16 is fed into a comparator 17 which compares it with the contents of the input register 12. The comparator 17 controls the clock generator 14 such that the clock operates when the outputs are not the same and stops the clock when the output from the input register 12 is the same as that from the pseudo-random generator 16.

An 8-bit counter 18 counts the number of clock signals from the clock generator 14 required to bring the output of the pseudo-random generator into agreement with the output from the input register 12. Thus the contents of the counter 18 is a binary number whose magnitude is proportional to the displacement of the disc 3 from a datum position.

The logic circuit 11 produces a "clear" signal I which resets the generator 16 and counter 18 at each trailing edge of signal A. An extra pulse generator 19 adds on one more clock pulse J to the pseudo-random generator 16 a short time after each pulse I but only when signal F or G indicates that motion is in one particular direction. The additional pulses J compensate for the fact that the read heads 9 and 10 are spaced seven instead of eight apart. Each extra pulse J has the effect of incrementing the pseudo-random generator one pseudo-random bit thus decrementing the clock pulse count to counter 18.

Figure 2:
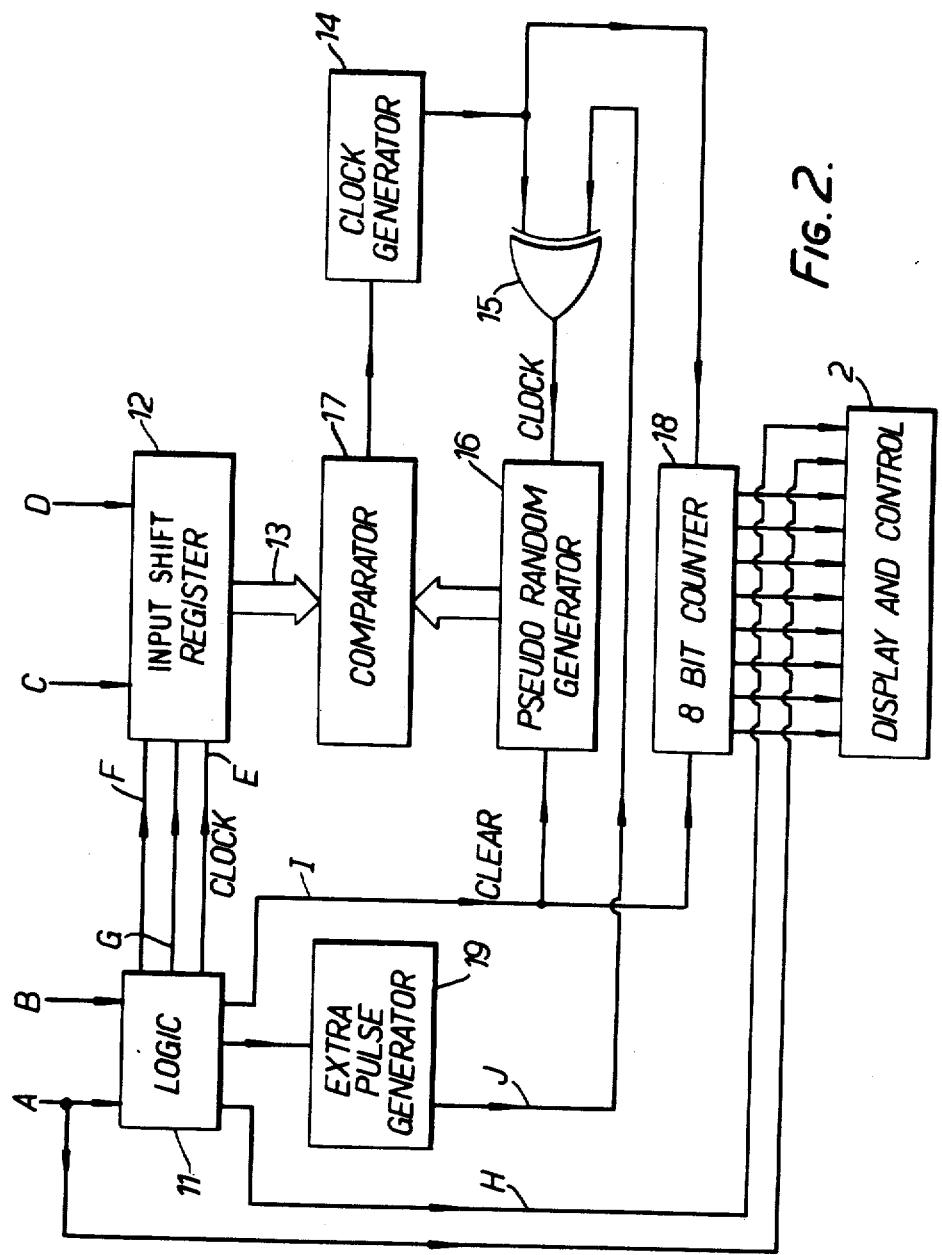
FIG. 2 is a block circuit diagram showing part of the apparatus of FIG. 1 in greater detail.
Figure 3:
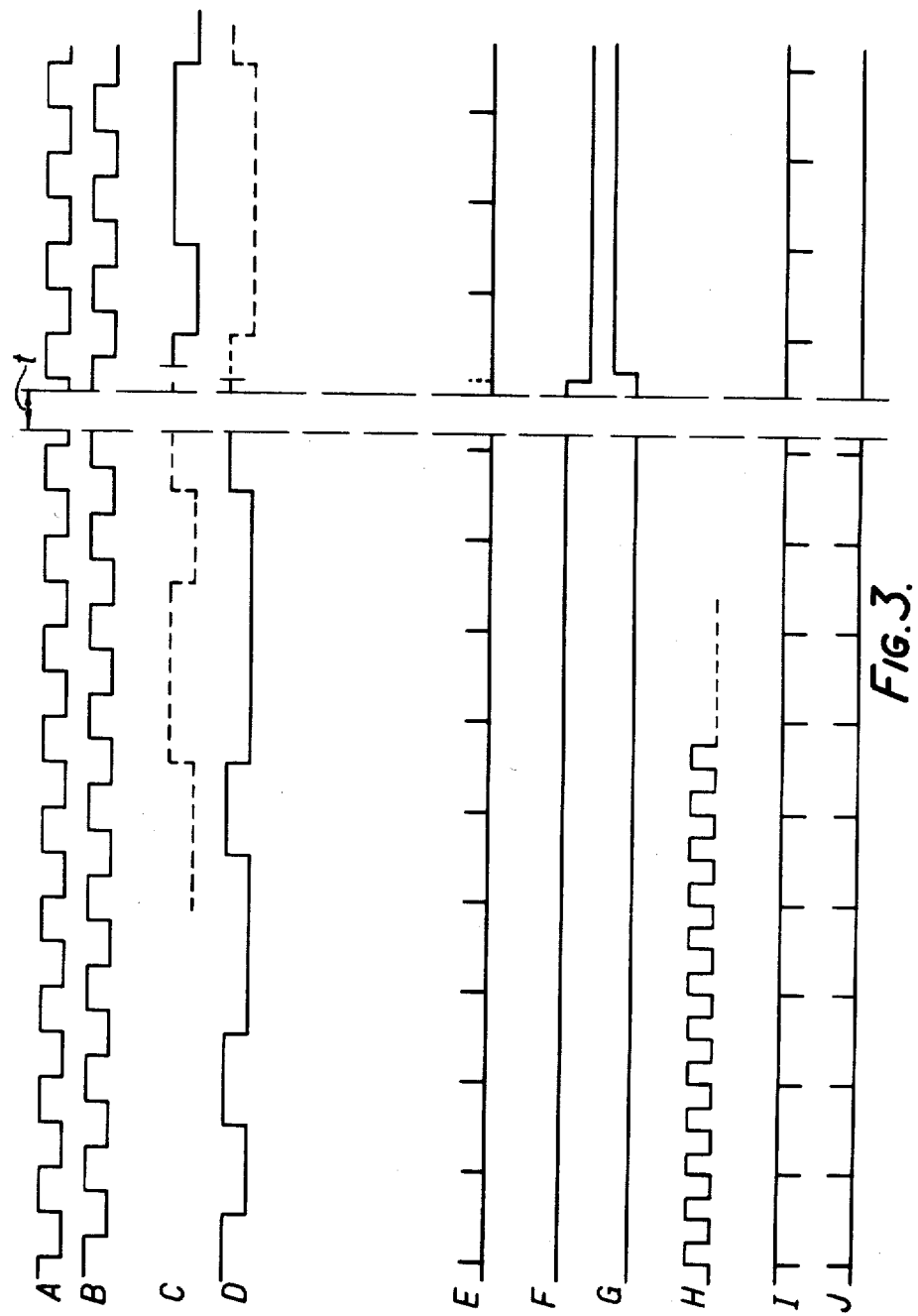
FIG. 3 is a pulse diagram showing at A to H signals on respective lines A to H of FIG. 2 assuming that a direction change occurs during the time interval t.

The parts of the circuit described so far with reference to FIG. 2 result in the output of counter 18 giving an eight bit word describing the position of the shaft 1. A further 2 bits are provided by the timing track 4. One of these is signal A directly from the track itself. The other is generated from outputs A and B which are passed through an exclusive OR gate in the logic circuit 11 to produce an output H.

Figure 2A:
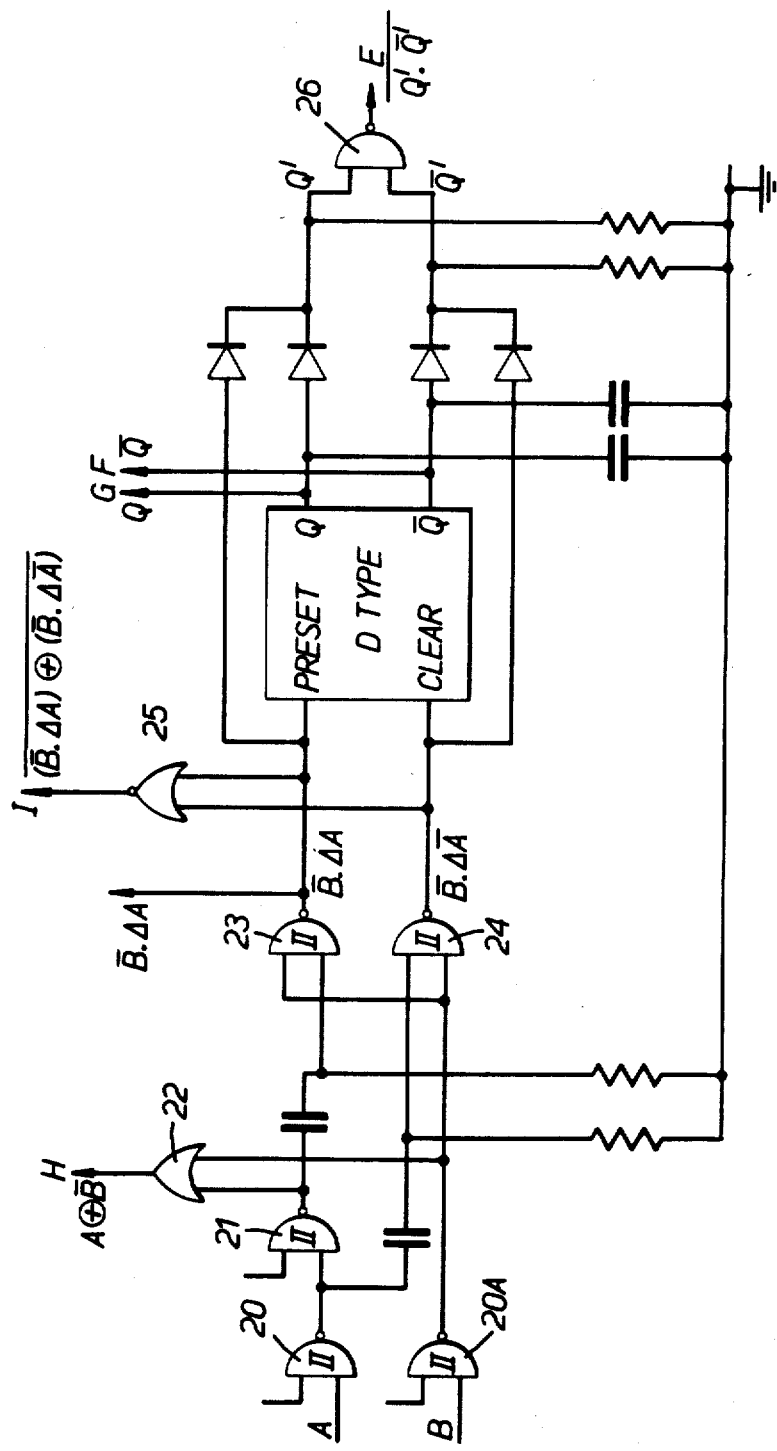
FIG. 2A is a circuit schematic showing part of FIG. 2 in greater detail.

The logic circuit 11 is shown in greater detail in FIG. 2A using conventional digital logic symbols as will be readily understood by those skilled in the art. Signals A and B are applied to NAND gates 20 and 20A respectively having Schmitt trigger inputs. The other inputs to the NAND gates 20 and 20A are kept high, as is that of a further NAND gate 21. Signal H is generated by applying signal A and inverted signal B to an exclusive OR gate 22. The clear signal I is produced by taking the outputs of NAND gates 23 and 24 and passing them through an exclusive OR gate and inverter 25. A signal from NAND gate 23 is also applied to extra pulse generator 19 to produce signal J. A conventional D type flip-flop is connected as shown for producing signals G and F which are taken from the outputs Q and $\bar{Q}$ of the D type flip-flop. Clock pulse E is obtained from NAND gate 26.

In an alternative form of the invention the read heads 5, 6, 9 and 10 could be mounted on a member which rotates relative to a supporting chassis carrying the tracks 4 and 8.

The input shift register 12 can be an integral unit or could be constituted by a suitably programmed computer behaving, because of its program, as a shift register and possibly also fulfilling other functions.

In another embodiment of the invention it would be possible to indicate linear motion instead of rotational motion.

We claim:

1. Apparatus for indicating the position of a rotatable member, comprising:
    a rotatable member;
    a code track disposed on said rotatable member and defining a pseudo-random sequence of binary digits consisting of ones and noughts and extending continuously around said rotatable member, the pseudo-random sequence including a given number of n consecutive noughts, and the digits of the sequence being arranged so that each group of n adjacent digits is different from each other group of n adjacent digits in the pseudo-random sequence; and
    reading means operatively positioned relative to said code track for reading n consecutive digits of the pseudo-random sequence, each n consecutive digits of the pseudo-random sequence defining a position of said member.

2. Apparatus as claimed in claim 1, further comprising a timing track disposed on said member and defining a sequence of timing intervals extending around said member; sensing means operatively positioned relative to said timing track for sensing the timing intervals and for producing timing signals corresponding to said timing intervals; and means connected for receiving the timing signals and for utilizing the timing signals to produce control signals which are coupled to said reading means for determining when digits are read from said code track.

3. Apparatus according to claim 2 and wherein said timing track presents a sequence of indicia having a constant spacing between indicia, said sensing means includes first and second detectors each having an output and producing a signal at said output which represents the spacing between indicia, said first and second detectors arranged to sense different parts of said timing track, which parts are spaced by a non-integral multiple of the spacing between the indcicia so that the relative phase of timing of the signals at the outputs of said first and second detectors is indicative of the direction of movement of said member.

4. Apparatus according to claim 2, wherein said sensing means includes output means at which the timing signals are present, and said apparatus further comprises means for utilizing the timing signals at the output means of said sensing means for indicating the position of said member to a greater accuracy than would be indicated by the n consecutive digits of the pseudo-random sequence as read by said reading means.

5. Apparatus as claimed in claim 1 and wherein said reading means includes a detector positioned such that the binary digits of said first code track move past said detector when said rotatable member moves, and a shift register connected to said detector, the binary digits of the first track being written into said shift register, wherein the contents of said shift register correspond to the position of said rotatable member.

* * * * *